Figure 1:
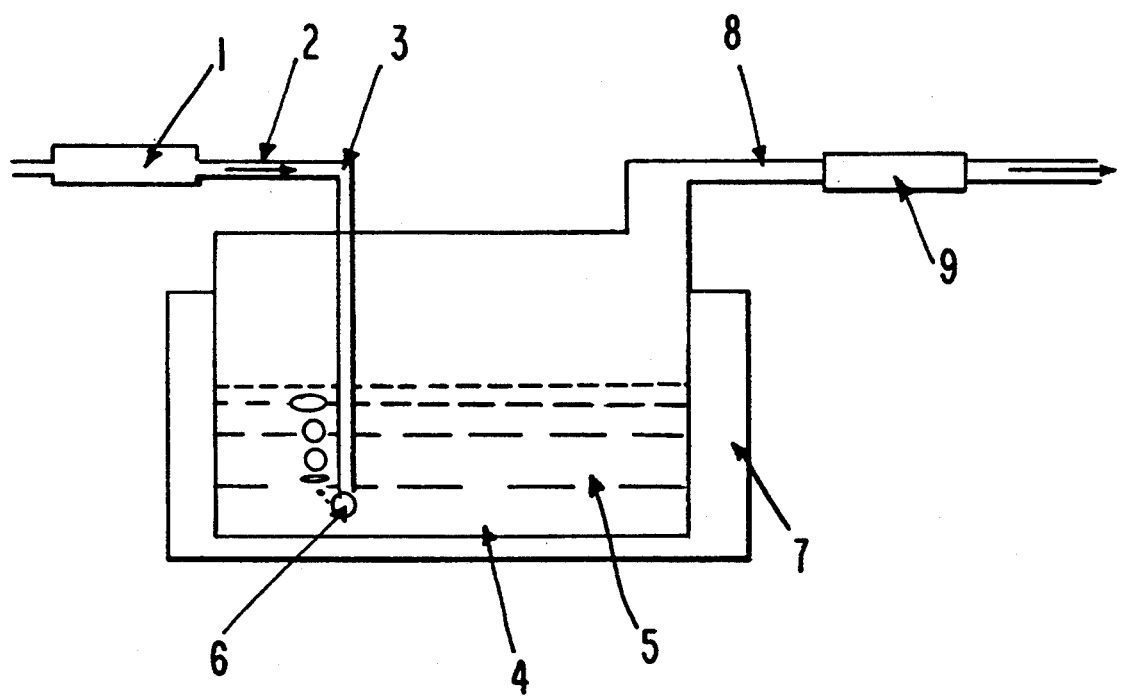

United States Patent
Boer

Patent Number: 5,431,736
Date of Patent: Jul. 11, 1995

[54] METHOD FOR TRANSFORMING A LIQUID FLOW INTO A GAS FLOW AND A DEVICE FOR IMPLEMENTING THE METHOD

[75] Inventor: Hendrik J. Boer, Lochem, Netherlands

[73] Assignee: Bronkhorst High-Tech B.V., Ruurlo, Netherlands

[21] Appl. No.: 317,285

[22] Filed: Oct. 3, 1994

Related U.S. Application Data

[63] Continuation of Ser. No. 22,071, Feb. 24, 1993, abandoned.

[30] Foreign Application Priority Data

Mar. 6, 1992 [NL] Netherlands ............ 9200415

[51] Int. Cl.⁶ .................................. C23C 16/00
[52] U.S. Cl. ............................. 118/726; 261/62; 261/152; 261/156
[58] Field of Search ............... 118/726; 261/62, 152, 261/156

[56] References Cited

U.S. PATENT DOCUMENTS

| 921,934 | 5/1909 | Willard | 261/156 |
|---|---|---|---|
| 1,122,703 | 12/1914 | Dull | 261/156 |
| 1,202,771 | 10/1916 | Babbitt | 261/156 |
| 1,207,664 | 12/1916 | Thurston | 261/156 |
| 1,798,065 | 3/1931 | Clark | 261/156 |
| 1,965,144 | 7/1934 | Kane | 261/156 |
| 3,759,444 | 9/1973 | Tanaka | 239/138 |
| 4,916,077 | 4/1990 | Forster | 261/78.2 |
| 4,950,456 | 8/1990 | Forster | 261/78.2 |
| 5,204,314 | 4/1993 | Kirlin | 118/726 |

FOREIGN PATENT DOCUMENTS

| 435088 | 7/1991 | European Pat. Off. . |
|---|---|---|
| 0488909 | 6/1992 | European Pat. Off. . |
| 2151007 | 4/1973 | Germany . |
| 72520 | 5/1953 | Netherlands . |
| 578783 | 7/1946 | United Kingdom . |

OTHER PUBLICATIONS

Webster's New Collegiate Dictionary, G & C Merriam Co., Springfield, Mass., ©1973, p. 786.

*Primary Examiner*—Richard Bueker
*Attorney, Agent, or Firm*—Rosen, Dainow & Jacobs

[57] ABSTRACT

Method and device which is to be used for the implementation thereof for transforming a liquid flow into a gas flow, whereby the liquid flow is led into a space in which the liquid evaporates and the vapour which thus arises is carried off mixed with a carrier gas. By ensuring that the carrier gas flow is passed directly past the liquid inlet port, whereby a complete mixing of both is achieved, and by keeping the way to the evaporation space short, a stabile and continuous gas flow is obtained. The provisions for mixing and evaporation are integrated in the device.

3 Claims, 2 Drawing Sheets

METHOD FOR TRANSFORMING A LIQUID FLOW INTO A GAS FLOW AND A DEVICE FOR IMPLEMENTING THE METHOD

This application is a continuation of application Ser. No. 08/022,071, filed Feb. 24, 1993, now abandoned.

The invention relates to a method for transforming a liquid flow into a gas flow, whereby the liquid flow is led into a space in which the liquid evaporates and the vapour which thus arises is carried off mixed with a carrier gas.

Such methods are known and are used, for example, in places where the gas or vapour flow concerned is necessary for implementing processes of chemical deposition, such as are carried out when making chips.

A common method for achieving such a transformation is the so-called bubbler method. Thereby a carrier gas—for example, oxygen—is led into the liquid which is to be evaporated, for example, Tetra Ethyl Orto Silicate—TEOS. The carrier gas causes bubbles in the liquid. If the liquid is kept at a certain high temperature, a mixture will be formed of carrier gas and vapour in the—closed-off—space above the liquid surface. This mixture is then carried-off and can be used, for example, in the said deposition process.

This known method has disadvantages, the outgoing gas flow—therefore, the mixture—is not continuous and not stabile. Large variations with regard to stability and continuity can arise and such a flow will even be entirely interrupted now and again by, for example, gas envelopes. The disadvantages are particularly salient if one works with weak liquid flows, such as of 10–500 gram/hour.

The instability and the discontinuity is caused especially as a result of the fact that the temperature is such a critical parameter with regard to those units of size, but other parameters also influence both units to a considerable degree; such as the pressure, the size of the bubbles and the height of the liquid level. May it also be noted that this bubbler method may if necessary also be carried out without the use of a carrier gas. However, in that event a relatively high temperature—for TEOS approx. 110° C.—is necessary.

Figure 2:
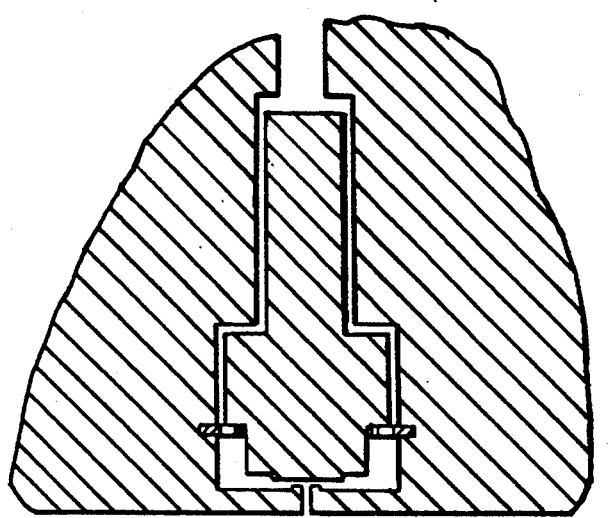
Figure 3:
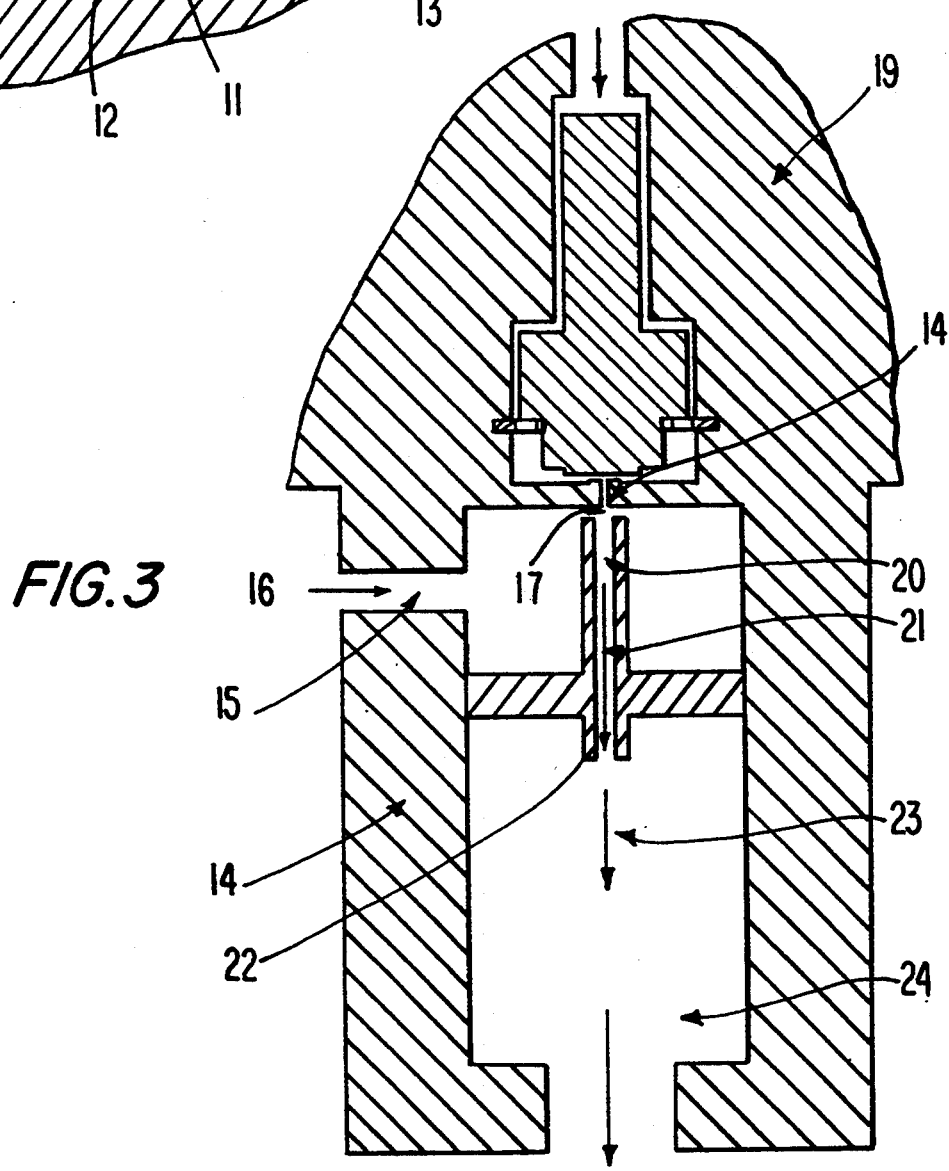

As depicted in FIGS. 2 and 3, the present invention relates to both a method and a device. The method relates to transforming liquid flow into gas flow in a container comprising the steps of first supplying a liquid into a first passage having a first inlet port extending into the container, wherein the first inlet port has at least one adjustable valve, and then passing the liquid through a first outlet port within the container. The first outlet port is narrower in cross-sectional dimensions than the cross-sectional dimensions of the first inlet port. A carrier gas is supplied into a second passage having a second inlet port extending into said container with the carrier gas contacting the liquid upon the liquid exiting the first outlet port. The liquid and carrier gas are thoroughly mixed in a mixing space situated in the second passage immediately adjacent the first outlet port and between the second inlet and the second outlet port. The mixing space possesses narrower cross-sectional dimensions relative to the cross-sectional dimensions of said second inlet port and said second outlet port. The liquid and carrier gas are mixed in a space to form a complete mixture. The complete mixture under pressure is then directed through the second outlet port into a heated evaporation space to cause evaporation therein of said liquid to vapor to occur. The carrier gas and vapor are then vented from said container.

The device for implementing the method noted above comprises a container having a first passage with first inlet port means containing at least one adjustable valve and a first outlet port narrower in cross-sectional dimensions than the cross-sectional dimensions of the inlet port, the first inlet port and the first outlet port being suitable for passing a liquid therethrough. The container also has therethrough a second passage having a second inlet port and a second outlet port, the second inlet port and the second outlet port being suitable for supplying a carrier gas.

A mixing space is positioned in said second passage immediately adjacent the first outlet port and between the second inlet port and the second outlet port. The mixing space is suitable to completely mix the liquid with the carrier gas.

The second outlet port is positioned adjacent to the mixing space and interconnected with an evaporation space adjacent to the second passage in the container wherein evaporation of liquid to vapor takes place. The mixture of carrier gas and vapor is then vented from the evaporation space of the device.

The invention relates to a method, whereby the said disadvantages do not occur and to that end is characterized in that the liquid is brought into a mixing space via an inlet port: that a carrier gas flow is led directly across the opening of that inlet port in that space, with such a strength and so closely thereto, that as soon as liquid leaves the opening it has been mixed with the carrier gas; that the mixture of carrier gas and vapour/gas is led into the evaporation space, in which, possibly with the addition of heat, evaporation takes place, and that finally that flow leaves the evaporation space.

It is essential that the mixing and evaporation steps are carried out completely and in a controlled manner. For that purpose it is ensured that the liquid is mixed with the carrier gas "immediately", that is to say, before it has to travel a long way, and that the evaporation also takes place quickly after that. It is important, then, that as soon as a liquid which is to be evaporated appears in the space where mixing with the carrier gas occurs, it must be able to make extensive contact with the carrier gas. The carrier gas must therefore be led to and along the place where the liquid enters the mixing space and after that the mixture must be brought quickly—therefore, for example, moved across a short distance—into the evaporation space.

Heat is necessary for evaporation. Depending on the liquid which is to be evaporated and the quantity, heat must either be added or must be absorbed from the surroundings without undesired effects.

It appears that the stability and the continuity of the gas flow vary less than 1% in the event of application of the method according to the invention.

According to a form of implementation of the method according to the invention, it is advantageous to bring the liquid into the mixing space with the aid of an adjustable valve, and the mixture is transported under pressure to the evaporation space. Of course, if more than one liquid is being brought into the mixing space, several adjustable valves will be used; one for each liquid. The pressure under which the mixture is brought into the evaporation chamber is built-up with the aid of a nozzle which forms the exit of the mixing space.

Liquids on which the method according to the invention are applied are, for example: trimethylphosphate (TMP) $(CH_3O)_3P$; trimethylborate (TMB; $(CH_3O)_3B$); tetra-ethylorthosilicate (TEoS; $(CH_3-CH_2O)_4-Si$. Oxygen is used as a carrier gas for all three and in gas form they are used for the manufacture of semi-conductors.

In an implementation example of the method according to the invention, whereby TEoS is used as a liquid, work was carried out with a liquid flow of 30 gram/hour and with a carrier gas flow of oxygen of 6 l/minute. In order to ensure a good evaporation 10 J/s of added heat was necessary (in the event of use of TMP and TMB extra addition of heat turned out not to be necessary).

Another type of liquid for which the method according to the invention was used is $TICl_4$, whereby hydrogen is used as a carrier gas. In gas form this substance is applied for tempering metals, for example lathe tools.

The invention also includes a device with which the methods described above can be implemented. Such a device contains a supply for the liquid in a space in which evaporation and mixing with a carrier gas takes place and is equipped with an exit for the mixture of vapour and carrier gas. For that purpose the device is characterized in that the supply of the liquid consists of one or more adjustable valves opening-up into a mixing space, that means are present to lead the carrier gas in that space directly past that opening, with such a flow of mass that at that location the liquid and the carrier gas are completely mixed, that means are present to lead the flow from the mixing space to an evaporation space in which, possibly with the addition of heat, the evaporation takes place and from which the mixture of carrier gas and vapour leaves the device, whereby the valve or the valves, the mixing space and the evaporation space form one mechanical unity.

This latter point is essential for achieving the "short routes" to the mixing space and from there to the evaporation space.

A preferential design of a device according to the invention is characterized by the fact that the device consists of a container with a first passage in a wall for the valve, with a second passage in a wall for the supply of the carrier gas to immediately next to that first passage, with a mainly tubular part preferably approximately in the extension of that first passage which serves as a mixing space and which opens up via a nozzle into a closed evaporation space, one wall of which is equipped with an exit opening for the mixture of carrier gas and vapour/gas. The evaporation unit may be used in series, whereby the gas/vapour flow of the first one is used as a carrier gas for a subsequent one.

The invention will be explained further with the aid of a drawing, in which:

FIG. 1 schematically shows a known device for transforming the liquid flow into a gas flow;

FIG. 2 schematically shows the part of a device according to the invention where the mixing of the liquid with the carrier gas takes place;

FIG. 3 schematically shows a form of implementation of a device according to the invention.

In the known device shown in FIG. 1—a so-called "bubbler" installation —the carrier gas is supplied via a dosing mechanism 1 in the direction of the arrow 2 via the pipe 3 to a container 4 in which the liquid 5 which is to be evaporated is situated. In the container 4 the mixing of the carrier gas with the liquid 5 takes place and the evaporation also takes place. With the aid of a heating-regulating mechanism 7 which is present in the container for that purpose it is ensured that the amount of heat is added which is desired in order to have evaporation take place. The mixture of carrier gas and vapour/gas which arises is caught-up above the surface of the liquid 5 and is led via an exit pipe 8 and a dosing mechanism 9 to the place where the vapour is necessary.

The flow of the mixture which is generated in this known manner which leaves the device is not stabile and continuous.

FIG. 2 schematically shows an essential part of the device according to the invention, being that part in which the carrier gas is supplied to the opening-out of a valve in the mixing space. A carrier gas 10 flows in the direction of the arrow into the mixing space 11. The liquid which is to be evaporated flows into that mixing space 11 via the valve mouth 12. As a result of the fact that the carrier gas is led in a precise manner to the valve mouth, as soon as liquid threatens to "fall" into the mixing space 11 through the valve mouth, that liquid is "caught" by the carrier gas and is mixed thoroughly therewith. The mixture which is obtained in this manner is then led in the direction of the arrow 13 to the evaporation space.

FIG. 3 shows a sketch in more detail of a device according to the invention. The container 14 has an opening 15 in a wall, through which carrier gas 16 flows in the direction of the arrow to the mixing space 17. The carrier gas 16 is led to immediately under the exit opening 14 of the valve 19 (in general a magnetically operated valve), which opens out through an opening in a wall of the container 14 into the mixing space 17. May it be noted that, while only one valve is drawn in the drawing, a device according to the invention can have several intake valves, through which various liquids can be brought into the mixing space.

In the mixing space 17 the complete mixing takes place. The mixture then flows into the mainly tubular shaped part 20 according to arrow 21. The mixture is then sprayed via the spray part 22—see arrow 23—into the evaporation space 24. In that space the evaporation then takes place and from there the mixture of carrier gas and vapour is carried to the place of destination.

I claim:

1. A method for transforming liquid flow into gas flow in a container comprising the steps of:

supplying a liquid into a first passage having a first inlet port extending into said container, said first inlet port having at least one adjustable valve, and then passing said liquid through a first outlet port within said container, said first outlet port being narrower in cross-sectional dimensions than the cross-sectional dimensions of said first inlet port;

supplying a carrier gas into a second passage having a second inlet port extending into said container and a second outlet port, said carrier gas contacting said liquid upon its passing through said first outlet port;

thoroughly mixing said liquid and said carrier gas in a mixing space situated in said second passage immediately adjacent said first outlet port and between said second inlet port and said second outlet port, said mixing space having narrower cross-sectional dimensions relative to the cross-sectional dimensions of said second inlet port and said second outlet port;

thoroughly mixing said liquid and said carrier gas in said mixing space to form a complete mixture, and directing under pressure said complete mixture through said second outlet port into an evaporation space and heating said evaporation space to cause evaporation of said liquid to vapor contained therein, and venting said carrier gas and vapor from said container.

2. A device for implementing the method according to claim 1, comprising a container comprising a first passage having first inlet port means containing at least one adjustable valve and a first outlet port narrower in cross-sectional dimensions than the cross-sectional dimensions of said inlet port, said first inlet port and said first outlet port being suitable for passing a liquid therethrough; said container also having therethrough a second passage having a second inlet port and a second outlet port, said second inlet port and said second outlet port being suitable for supplying a carrier gas;

a mixing space positioned in said second passage immediately adjacent said first outlet port and between said second inlet port and said second outlet port, said mixing space having narrower cross-sectional dimensions relative to the cross-sectional dimensions of said second inlet port and said second outlet port, said mixing space being suitable to completely mix the liquid with the carrier gas;

said second outlet port adjacent to said mixing space being interconnected with an evaporation space adjacent to said second passage in said container wherein evaporation of said liquid to vapor takes place and from which the mixture of carrier gas and vapor is vented from said device.

3. The device defined in claim 2, which contains a tubular part extending from adjacent said mixing space and which opens up via a nozzle into said evaporation space, one wall of which is equipped with an exit opening for the mixture of carrier gas and vapor/gas.

* * * * *